United States Patent
Seong et al.

(10) Patent No.: US 7,485,479 B2
(45) Date of Patent: Feb. 3, 2009

(54) NITRIDE-BASED LIGHT EMITTING DEVICE AND METHOD OF MANUFACTURING THE SAME

(75) Inventors: Tae-yeon Seong, Gwanju-si (KR); Kyoung-kook Kim, Siheung-si (KR); June-o Song, Gwangju-si (KR); Dong-seok Leem, Gwangju-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 93 days.

(21) Appl. No.: 11/649,236

(22) Filed: Jan. 4, 2007

(65) Prior Publication Data
US 2007/0111354 A1     May 17, 2007

Related U.S. Application Data

(62) Division of application No. 10/957,704, filed on Oct. 5, 2004, now Pat. No. 7,180,094.

(30) Foreign Application Priority Data
Oct. 8, 2003     (KR)   ....................... 10-2003-0069995

(51) Int. Cl.
*H01L 21/00*     (2006.01)
(52) U.S. Cl. .............................. 438/25; 438/26; 438/22; 438/48; 438/128
(58) Field of Classification Search .................. 257/79, 257/98, 103, 59, 72, 88–93, 453, 749, E21.011, 257/E21.045; 438/22, 25, 26, 27, 29, 48, 438/128
See application file for complete search history.

(56) References Cited

U.S. PATENT DOCUMENTS 5,065,404 A * 11/1991 Okajima et al. .......... 372/46.01

(Continued)

FOREIGN PATENT DOCUMENTS

CN     1330416 A     1/2002

(Continued)

OTHER PUBLICATIONS

Young-Don Ko et al., "Characteristics of ZnO/Si prepared by Zn3P2 diffusion", Applied Surfaces Science 202, (2002) pp. 266-271, Elsevier Science B.V.*

(Continued)

*Primary Examiner*—Evan Pert
*Assistant Examiner*—Scott R Wilson
(74) *Attorney, Agent, or Firm*—Buchanan Ingersoll & Rooney PC

(57) ABSTRACT

Provided are a nitride-based light emitting device and a method of manufacturing the same. The nitride-based light emitting device has a structure in which at least an n-cladding layer, an active layer, and a p-cladding layer are sequentially formed on a substrate. The light emitting device further includes an ohmic contact layer composed of a zinc (Zn)-containing oxide containing a p-type dopant formed on the p-cladding layer. The method of manufacturing the nitride-based light emitting device includes forming an ohmic contact layer composed of Zn-containing oxide containing a p-type dopant on the p-cladding layer, the ohmic contact layer being made and annealing the resultant structure. The nitride-based light emitting device and manufacturing method provide excellent I-V characteristics by improving ohmic contact with a p-cladding layer while significantly enhancing light emission efficiency of the device due to high light transmittance of a transparent electrode.

22 Claims, 7 Drawing Sheets

U.S. PATENT DOCUMENTS

| | | | |
|---|---|---|---|
| 6,040,588 A * | 3/2000 | Koide et al. | 257/15 |
| 6,287,947 B1 | 9/2001 | Ludowise et al. | |
| 6,583,443 B1 | 6/2003 | Chang et al. | |
| 6,825,502 B2 | 11/2004 | Okazaki et al. | |
| 2003/0209723 A1* | 11/2003 | Sakai | 257/102 |
| 2004/0113156 A1* | 6/2004 | Tamura et al. | 257/79 |
| 2005/0121685 A1* | 6/2005 | Seong et al. | 257/99 |
| 2007/0267646 A1* | 11/2007 | Wierer et al. | 257/98 |

FOREIGN PATENT DOCUMENTS

| | | |
|---|---|---|
| CN | 1330416 A | 1/2002 |
| JP | 2002-164570 | 6/2002 |
| JP | 2002-164570 A | 6/2002 |
| JP | 2002-353499 A | 12/2002 |

OTHER PUBLICATIONS

Young-Don Ko et al.: "Characteristics of ZnO/Si prepared by $Zn_3P_2$ diffusion", Applied Surfaces Science 202, (2002) pp. 266-271, Elsevier Science B.V.

"Recent Advances in Research on p-Type ZnO", Journal of Inorganic Materials, Jan. 2003, vol. 18, No. 1, pp. 11-18, China Academic Journal Electronic Publishing House (cited in Chinese Office Action).

Chinese Office Action (with English translation) dated Feb. 9, 2007.

Office Action issued by the Chinese Patent Office in corresponding CN Patent Application No. 200410092115.4, Aug. 24, 2007; and partial English-language translation thereof.

* cited by examiner ent content of which is incorporated herein by reference. This
NITRIDE-BASED LIGHT EMITTING DEVICE AND METHOD OF MANUFACTURING THE SAME This application is a divisional of prior U.S. application Ser. No. 10/957,704 filed on Oct. 5, 2004 and claims priority under 35 U.S.C. § 120 to such prior application, the entire content of which is incorporated herein by reference. This application also claims priority under 35 U.S.C. § 119 to Korean Patent Application No. 2003-69995, filed on Oct. 8, 2003, in the Korean Intellectual Property Office, the disclosure of which is incorporated herein in its entirety by reference.

BACKGROUND OF THE INVENTION

1. Field of the Disclosure

The present disclosure relates to a nitride-based light emitting device and a method of manufacturing the same, and more particularly, to a nitride-based light emitting device with a transparent film electrode structure designed to provide a low specific contact resistance and high light transmittance and a method of manufacturing the same.

2. Description of the Related Art

The formation of an ohmic contact between a semiconductor and an electrode is of considerable importance in realizing light emitting devices such as light emitting diodes (LEDs) and laser diodes (LDs) that utilize a nitride-based compound semiconductor such as gallium nitride (GaN).

GaN-based light emitting devices are classified into top-emitting LEDs (TLEDs) and flip-chip LEDs (FCLEDs). In commonly used TLEDs employing a Ni/Au ohmic contact layer, light exits through the ohmic contact layer in contact with a p-cladding layer.

A Ni/Au layer acts as a semi-transparent ohmic contact layer having excellent a specific contact resistance of $10^{-4}$ to $10^{-3}$ $\Omega cm^2$. Annealing of the Ni/Au layer at a temperature of 500 to 600° C. in an oxygen ($O_2$) atmosphere leads to the formation nickel oxide (NiO) at the interface between the p-GaN cladding layer and the Ni layer, thereby lowering a Schottky barrier height (SBH). Thus, holes, which are a majority of the carriers, can be easily injected into the surface of the p-GaN cladding layer, thus increasing effective carrier concentration near the surface of the p-cladding layer.

Annealing of Ni/Au on the p-cladding layer results in disassociation of a Mg—H complex in the GaN, which reactivates Mg dopants by increasing the concentration of Mg dopants on the surface of the GaN. As a result of reactivation, the effective carrier concentration increases above $10^{19}$ holes/$cm^3$ on the surface of the p-cladding layer, which causes tunneling conductance between the p-cladding layer and the ohmic contact layer containing NiO, thus obtaining an improved ohmic conductance.

Due to their low light utilization efficiency, a TLED using a Ni/Au semi-transparent film electrode cannot be readily applied to next generation light emitting devices with large capacities and high brightness.

One approach to overcome the limitation in the output power of TELDs is to use indium tin oxide (ITO). ITO is a transparent conductive oxide having superior light transmittance over a semi-transparent Ni/Au used as the conventional p-ohmic contact layer. However, while increasing the output power of a light emitting device, an ITO ohmic contact layer requires a high operating voltage due to a high ohmic contact resistance between p-GaN and ITO, which generates much heat. As an alternative approach, Japanese Laid-open Patent Application No. 2002-164570 discloses that high output power was obtained using p-GaN as a transparent electrode layer. However, since the above-cited patent obtains p-ZnO by codoping Ga and N, it is very difficult to actually use the p-ZnO as a transparent electrode for a p-GaN-based light emitting device. Furthermore, since it is known that the p-ZnO suffers from many reliability problems, its use as an electrode for a p-GaN light emitting device results in a degradation of device reliability.

To address these problems, there is an urgent need to develop a high quality ohmic contact layer with low specific contact resistivity that ensures the formation of a transparent electrode layer.

SUMMARY OF THE INVENTION

The present invention provides a nitride-based light emitting device with a transparent film electrode structure designed to provide a low specific contact resistance and high light transmittance, and a method of manufacturing the same.

According to an aspect of the present invention, there is provided a nitride-based light emitting device comprising: a substrate; an n-cladding layer disposed on the substrate; an active layer disposed on the n-cladding layer; a p-cladding layer disposed on the active layer; and an ohmic contact layer composed of a zinc (Zn)-containing oxide containing a p-type dopant disposed on the p-cladding layer.

According to specific embodiments of the preset invention, the Zn-containing oxide may be a compound selected from the group consisting of ZnO, $Mg_xZn_{1-x}O$, and $Be_xZn_{1-x}O$. The p-type dopant may be at least one of phosphor (P) and nitrogen (N). The concentration of the p-type dopant contained in the Zn-containing oxide may be in the range of 0.01 to 30 percent by weight. The ohmic contact layer may be formed to a thickness of 0.1 to 1,000 nm.

The light emitting device may further comprise a reflective layer composed of at least one element selected from the group consisting of Ag, Al, Zn, Mg, Ru, Ti, Rh, Cr, and Pt formed on the ohmic contact layer. The reflective layer may be formed to a thickness of 10 to 2,000 nm.

The light emitting device according to the present invention may further comprise a first electrode layer composed of at least one element selected from the group consisting of Ni, Au, Pt, Pd, Mg, Cu, Zn, Ag, Sc, Co, Rh, Li, Be, Ca, Ru, Re, Ti, Ta, Na, and La interposed between the p-cladding layer and the ohmic contact layer.

Alternatively, the light emitting device may further comprise a second electrode layer composed of at least one element selected from the group consisting of Ni, Au, Pt, Pd, Mg, Cu, Zn, Ag, Sc, Co, Rh, Li, Be, Ca, Ru, Re, Ti, Ta, Na, and La interposed formed between the ohmic contact layer and the reflective layer.

According to another aspect of the present invention, there is provided a method of manufacturing a nitride-based light emitting device in which at least an n-cladding layer, an active layer, and a p-cladding layer are sequentially formed on a substrate, the method comprising: forming an ohmic contact layer composed of a Zn-containing oxide containing a p-type dopant on the p-cladding layer; and annealing the resultant structure obtained by the forming of the ohmic contact layer.

According to specific embodiments of the method, the Zn-containing oxide may be a compound selected from the group consisting of ZnO, $Mg_xZn_{1-x}O$, and $Be_xZn_{1-x}O$. The active layer may have an InGaN/GaN multiquantum well (MQW) or AlGaN/GaN MQW structure.

The method may further comprise forming an n-current blocking layer on the p-cladding layer before the forming the ohmic contact layer. The n-current blocking layer may be formed to a thickness of 0.1 to 500 nm. The n-current blocking layer may be composed of a transparent conductive oxide or an n-GaN-based compound. The transparent conductive oxide may be one selected from the group consisting of $In_2O_3$, $SnO_2$, and indium tin oxide (ITO).

Alternatively, the method may further comprise, before the forming the ohmic contact layer, forming a first electrode layer on the p-cladding layer from at least one element selected from the group consisting of Ni, Au, Pt, Pd, Mg, Cu, Zn, Ag, Sc, Co, Rh, Li, Be, Ca, Ru, Re, Ti, Ta, Na, and La.

Alternatively, the method may further comprise, before the annealing, forming a second electrode layer on the ohmic contact layer from at least one element selected from the group consisting of Ni, Au, Pt, Pd, Mg, Cu, Zn, Ag, Sc, Co, Rh, Li, Be, Ca, Ru, Re, Ti, Ta, Na, and La.

Alternatively, the method may further comprise, before the annealing, forming a reflective layer on the ohmic contact layer from at least one element selected from the group consisting of Ag, Al, Zn, Mg, Ru, Ti, Rh, Cr, and Pt. The method may further comprise, before the annealing, forming a second electrode layer between the reflective layer and the ohmic contact layer from at least one element selected from the group consisting of Ni, Au, Pt, Pd, Mg, Cu, Zn, Ag, Sc, Co, Rh, Li, Be, Ca, Ru, Re, Ti, Ta, Na, and La. The reflective layer may be formed to a thickness of 10 to 2,000 nm. The first electrode layer may be formed to a thickness of 0.1 to 1,000 nm.

The annealing may be performed at a temperature of 100 to 800° C. for 10 seconds to 3 hours. The annealing may be performed in a gaseous atmosphere containing at least one of $N_2$, Ar, He, $O_2$, H, and air.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
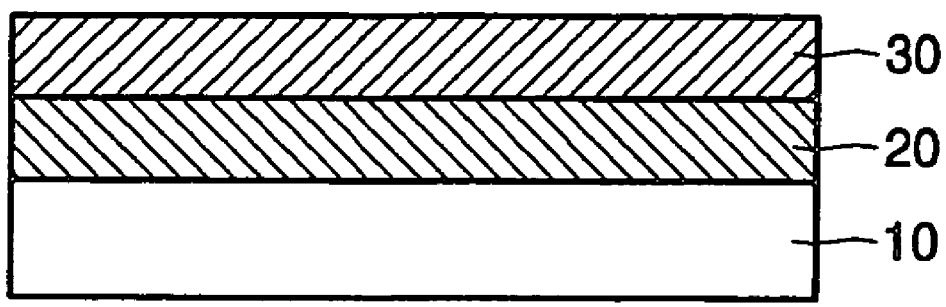
FIG. 1 is a cross-sectional view of a p-electrode structure according to a first embodiment of the present invention.

Hereinafter, a nitride-based light emitting device and a method of manufacturing the same according to embodiments of the present invention will be described in detail with reference to the attached drawings. The present invention should not be construed as being limited to the embodiments set forth herein. Throughout the drawings like reference numerals refer to like elements.

Referring to FIG. 1, a p-electrode structure according to a first embodiment of the present invention includes an ohmic contact layer 30, which acts as a transparent film electrode.

In the present embodiment, a III-nitride-based p-cladding layer 20 and the ohmic contact layer 30 are sequentially formed on a substrate 10.

The p-cladding layer 20 contains a p-type dopant in a III-nitride-based compound represented by the general formula $Al_xIn_yGa_zN(0 \leq x \leq 1, 0 \leq 1, 0 \leq z \leq 1, 0 \leq x+y+z \leq 1)$. The p-type dopant may be Mg, Zn, Ca, Sr, or Ba.

The ohmic contact layer 30 contains at least one of P and N in a Zn-containing oxide. The Zn-containing oxide may be ZnO, $Mg_xZn_{1-x}O$, or $Be_xZn_{1-x}O$. That is, the ohmic contact layer 30 may be p-ZnO, p-$Mg_xZn_{1-x}O$, p-$Be_xZn_{1-x}O$ by adding at least one of P and N as the p-type dopant to ZnO, $Mg_xZn_{1-x}O$, or $Be_xZn_{1-x}O$, respectively.

When p-type carriers are injected into the ohmic contact layer 30. (hole concentration of $10^{15}$~$10^{19}$/cm$^3$, hole mobility of 0.01 to 10), the effective p-type carrier concentration is increased on the surface of the p-cladding layer 20. Since this causes tunneling conductance, it is possible to make a good ohmic contact.

The concentration of the p-type dopant contained in the Zn-containing oxide is in the range of 0.01 to 30 percent by weight (weight %).

A solid compound such as $Zn_3P_2$, $ZnP_2$, $Mg_3P_2$, $Zn_3N_2$, or$Mg_3N_2$s may be used as the p-type dopant instead of a conventionally used solid oxide such as $P_2O_5$.

Since the above-identified solid compounds allow for easier adjustment of carrier or hole concentration in the p-cladding layer 20 and the ohmic contact layer 30 than a solid oxide, it is easy to form the ohmic contact layer 30 having excellent ohmic contact characteristics.

Furthermore, use of ternary p-type Zn-containing oxides containing Mg or Be as the p-type dopant in the p-cladding layer 30 can increase the effective hole concentration in the p-type cladding layer 20, thereby improving the characteristics of the ohmic contact layer 30. The ternary p-type Zn-containing oxide can also have a larger bandgap than a binary p-type Zn-containing oxide, thereby improving the light emission efficiency when used in the ohmic contact layer 30 in an AlGaN/GaN light emitting device.

The thickness of the ohmic contact layer 30 ranges from 0.1 to 1,000 nm. The ohmic contact layer 30 may be deposited using an electron-beam (e-beam) evaporator, a thermal evaporator, sputtering deposition, or pulsed laser deposition (PLD). Furthermore, the deposition temperature ranges from 20 to 1,500° C. and the pressure within an evaporator ranges from about $10^{-12}$ Torr to atmospheric pressure.

Figure 2:
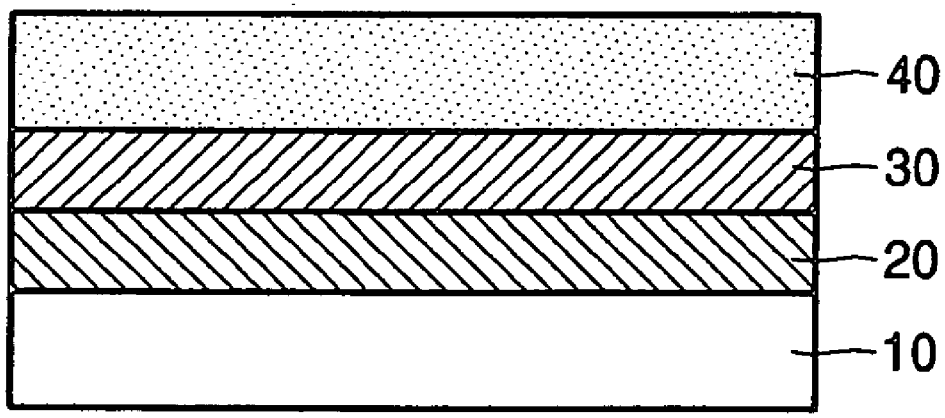
FIG. 2 is a cross-sectional view of a p-electrode structure according to a second embodiment of the present invention.

FIG. 2 is a cross-sectional view of a p-electrode structure according to a second embodiment of the present invention.

Referring to FIG. 2, the p-electrode structure includes an ohmic contact layer 30 and a reflective layer 40. An III-nitride-based p-cladding layer 20, the ohmic contact layer 30, and the reflective layer 40 are sequentially formed on a substrate 10.

The ohmic contact layer 30 has the same composition and characteristics as that in the first embodiment. The reflective layer 40, which is the uppermost layer in the p-electrode structure, is used for fabrication of a flip-chip light emitting device and is composed of a material that exhibits oxidation stability, consistent characteristics, and high reflectivity and can prevent surface degradation at temperature of 200 to 600° C.

The reflective layer 40 may be made of a reflective element selected from the group consisting of Ag, Al, Zn, Mg, Ru, Ti, Rh, Cr, and Pt. The thickness of the reflective layer 40 may be in the range of about 10 to about 2,000 nm. The reflective layer 40 may be formed using an e-beam evaporator.

The ohmic contact layer 30 and the reflective layer 40 are annealed after deposition. Annealing is performed at a temperature of 100 to 800° C. in vacuum or in a gaseous atmosphere for 10 seconds to 3 hours. At least one of $N_2$, Ar, He, $O_2$, $H_2$, and air may be injected into a reactor during annealing.

A process of fabricating a p-electrode structure according to an embodiment of the present invention will now be described.

First, a structure in which a p-cladding layer 20 composed mainly of GaN is formed on a substrate 10 with a surface cleaned in an ultrasonic bath with acetone, methanol, and distilled water at a temperature of 60° C. for five minutes. Hard baking is then performed for 10 minutes at 100° C. to remove water from the specimen.

A photoresist is spin coated on the p-cladding layer 20 at 4,500 rpm, followed by soft baking of the p-cladding layer 20 for 15 minutes at 85° C. Subsequently, to develop a mask pattern, a mask is aligned relative to the specimen and 22.8 mW ultraviolet (UV) light is then irradiated on the mask for 15 seconds. The resultant structure is then developed for 25 seconds within a developer diluted at a ratio of 1:4 with distilled water, and then immersed in a BOE solution for 5 minutes, which allows a contamination layer to be removed from the developed specimen. Then, to deposit the ohmic contact layer 30 using an e-beam evaporator, ZnO in a powder form is mixed with $Zn_3P_2$ in the ratio of about 9.5:0.5 and sintered to produce a sample that is then mounted onto a stage within a chamber of the e-beam evaporator.

Lift-off is performed by immersing the specimen in acetone and then the specimen is annealed for 1 minute in a rapid thermal annealer (RTA) in an air and $N_2$ atmosphere ambient at 530° C. to form the p-electrode structure.

Figure 3:
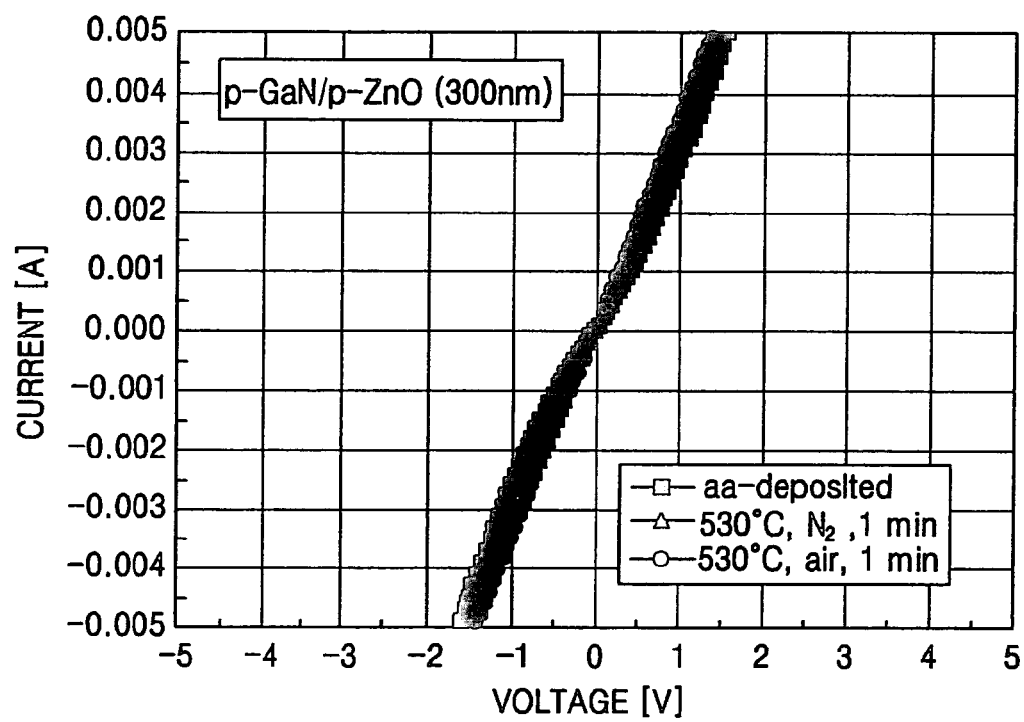
FIG. 3 is a graph showing current-voltage (I-V) characteristics of annealed and non-annealed p-electrode structures according to the first embodiment of the present invention.

FIG. 3 is a graph showing electrical characteristics of the structures obtained before and after annealing in the air and $N_2$ atmosphere at 530° C. after depositing the ohmic contact layer 30 composed of p-ZnO doped with P on the p-GaN cladding layer 20 with a carrier concentration of $4 \times 10^{17} cm^{-3}$ to $5 \times 10^{17} cm^{-3}$ such that the combination of the ohmic contact layer 30 and the p-GaN cladding layer 20 has a thickness of about 300 nm.

Referring to FIG. 3, the non-annealed p-GaN/p-ZnO structure exhibits nonlinear I-V characteristics indicating a rectifying characteristic while the annealed structure has linear I-V characteristics indicating an ohmic contact characteristic, and has a low specific contact resistance of about $10^{-5}$ to $10^{-4} \Omega \, cm^2$.

Figure 4:
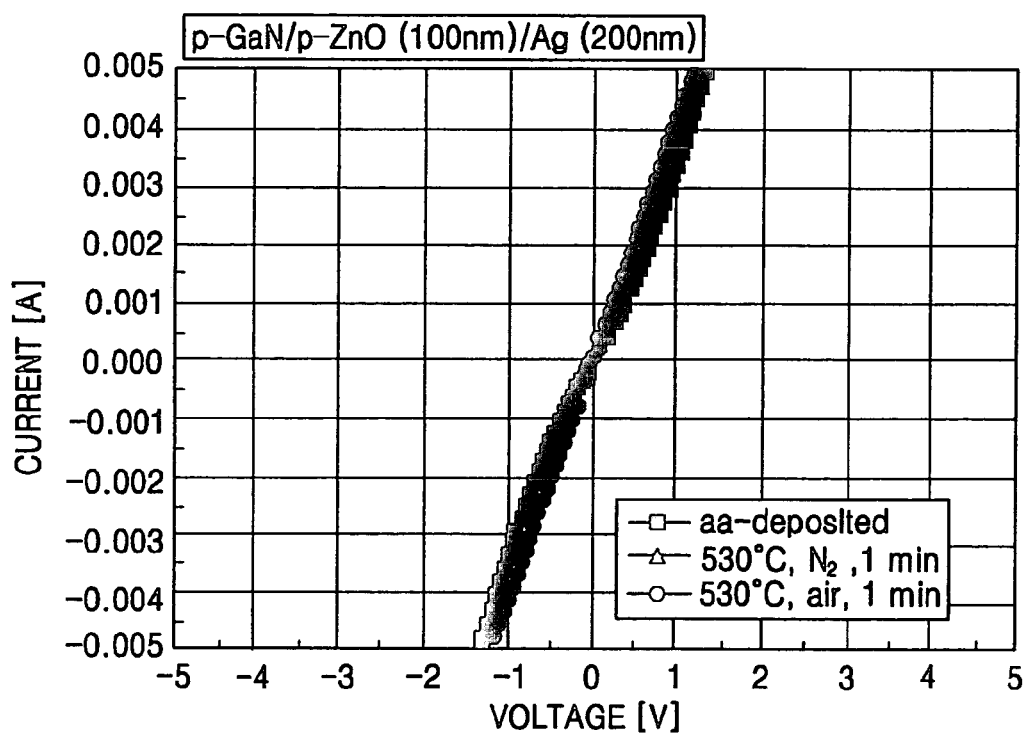
FIG. 4 is a graph showing I-V characteristics of annealed and non-annealed p-electrode structures according to the second embodiment of the present invention.

FIG. 4 is a graph showing electrical characteristics of the structures obtained before and after annealing in the air and $N_2$ atmosphere at 530° C. after sequentially depositing the ohmic contact layer 30 made of p-ZnO doped with P to a thickness of about 100 nm and Ag reflective layer 40 to a thickness of about 200 nm on the p-GaN cladding layer 20 with a carrier concentration of $4 \times 10^{17} cm^{-3}$ to $5 - 10^{17} cm^{-3}$.

Referring to FIG. 4, the non-annealed p-GaN/p-ZnO/Ag structure exhibits nonlinear I-V characteristics indicating a rectifying characteristic while the annealed structure has linear I-V characteristics indicating an ohmic contact characteristic, and has a low specific contact resistance of about $10^{-5}$ to $10^{-4} \Omega \, cm^2$. In particular, the electrode structure including the ohmic contact layer 30 and the reflective layer 40 exhibits superior I-V characteristics over the electrode structure not including the reflective layer 40.

Figure 5:
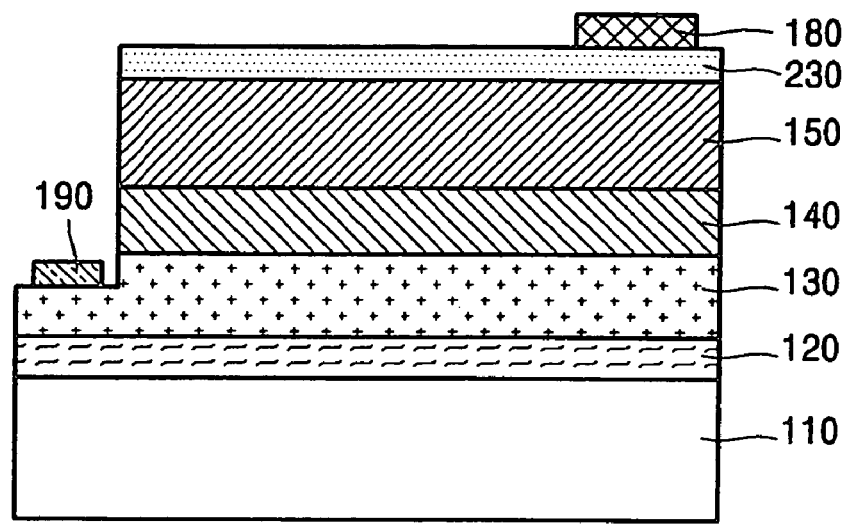
FIGS. 5-8 are cross-sectional views of light emitting devices incorporating the p-electrode structure shown in FIG. 1.

FIG. 5 shows an example of a light emitting device incorporating the p-electrode structure shown in FIG. 1. Referring to FIG. 5, the light emitting device includes a substrate 110, and a buffer layer 120, an n-cladding layer 130, an active layer 140, a p-cladding layer 150 and an ohmic contact layer 230 sequentially formed on the substrate 110. The light emitting device further includes a p-electrode pad 180 and an n-electrode pad 190.

The substrate 110 may be formed of sapphire or silicon carbide (SiC). The buffer layer 120 need not be included. Each of the buffer layer 120 the n-cladding layer 130, the active layer 140 and the p-cladding layer 150 is essentially composed of III-nitride-based compound represented by the general formula $Al_xIn_yGa_xN$ ($0 \leq x \leq 1$, $0 \leq y \leq 1$, $0 \leq z \leq 1$, $0 \leq x+y+z \leq 1$), and the n- and p-cladding layers 130 and 150 contain appropriate dopants in addition to the III-nitride-based compounds. The active layer 140 may be formed as a single layer or a multiquantum well (MQW) layer or may have other structures known in the art.

For example, when the main component of each layer is a GaN compound, the buffer layer 120 can be composed of GaN, the n-cladding layer 130 may contain an n-type dopant such as Si, Ge, Se, or Te in addition to GaN, the active layer 140 may have an InGaN/GaN MQW or AlGaN/GaN MQW structure, and the p-cladding layer 150 may contain a p-type dopant such as Mg, Zn, Ca, Sr, or Ba in addition to GaN.

An n-ohmic contact layer (not shown) may be interposed between the n-cladding layer 130 and the n-electrode pad 190 and have a Ti/Al structure or an other general composition. The p-electrode pad 180 may have a Ni/Au or Ag/Au structure.

Each layer may be formed using an e-beam evaporator, physical vapor deposition (PVD), chemical vapor deposition (CVD), PLD, a dual-type thermal evaporator, or sputtering.

The ohmic contact layer 230 is made of a p-type Zn-containing oxide containing at least one of P and N as a dopant as described with reference to FIG. 1.

Figure 6:
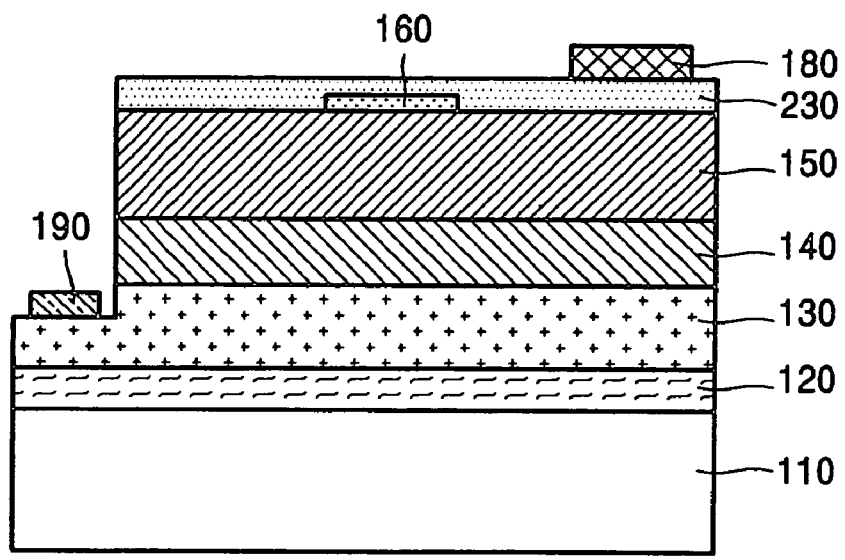

FIG. 6 shows an example of a light emitting device including an n-current blocking layer 160 that is formed on the p-cladding layer 150 prior to forming the ohmic contact layer 230 shown in FIG. 5.

The n-current blocking layer 160 is used to block a current from being injected directly into the active layer 140, thereby increasing the size of an active region and improving light emission. The n-current blocking layer 160 is made of a transparent conductive film exhibiting n-type characteristics in which the majority o carriers are electrons. For example, the n-current blocking layer 160 may be composed of a transparent conductive oxide or an n-GaN-based compound. The transparent conductive oxide is $In_2O_3$, $SnO_2$, or ITO. The n-GaN-based compound is n-GaN, n-InGaN, or n-AlGaN. The n-current blocking layer 160 can be formed to a thickness of 0.1 to 500 nm.

Figure 7:
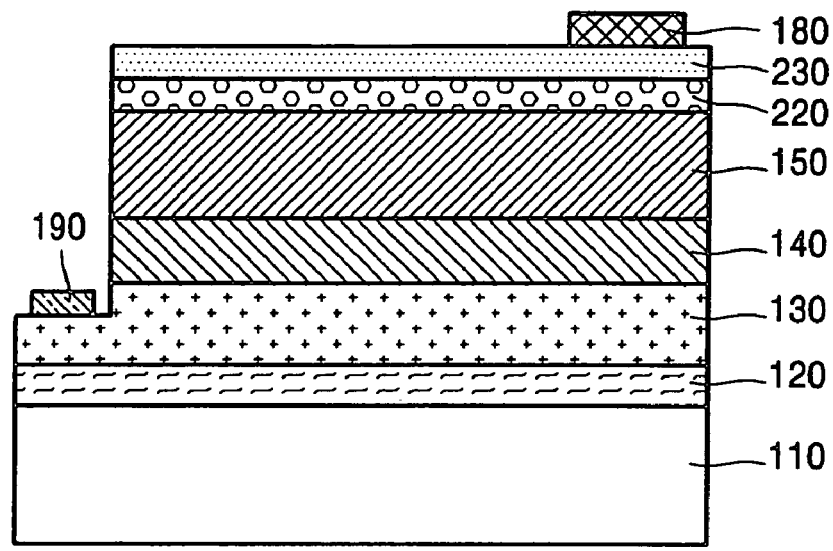

As shown in FIG. 7, the light emitting device may have a structure in which an electrode layer 220 is formed between the ohmic contact layer 230 and the p-cladding layer 150. The electrode layer 220 may be composed of an alloy or solid solution of one or two elements selected from the group consisting of Ni, Au, Pt, Pd, Mg, Cu, Zn, Ag, Sc, Co, Rh, Li, Be, Ca, Ru, Re, Ti Ta, Na, and La. Since the elements constituting the electrode layer 220 can adjust the concentration of p-type Zn-containing oxide, it may be advantageous to form a p-GaN ohmic contact.

Figure 8:
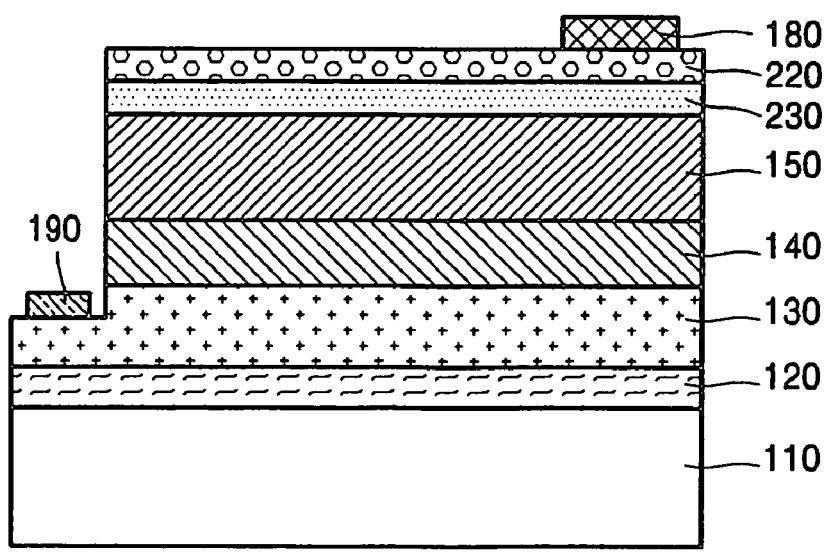

Referring to FIG. 8, the light emitting device may also have a structure in which the electrode layer 220 is formed on the ohmic contact layer 230. The electrode layer 220 may be made of the materials described earlier with reference to FIG. 7.

Figure 9:
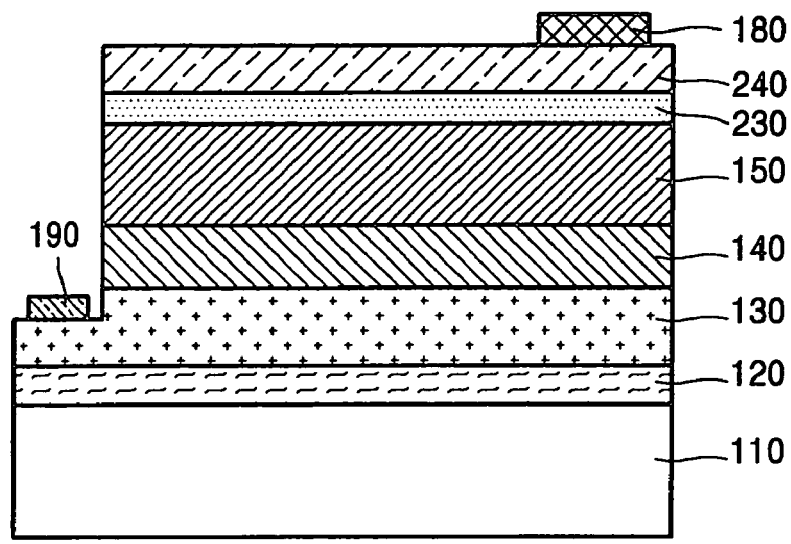
FIGS. 9-11 are cross-sectional views of light emitting devices incorporating the p-electrode structure shown in FIG. 2.

FIG. 9 shows an example of a light emitting device in which a reflective layer 240 is formed on the ohmic contact layer 230. The reflective layer 240 may be made of a metal selected from the group consisting of Ag, Al, Zn, Mg, Ru, Ti, Rh, Cr, and Pt.

Figure 10:
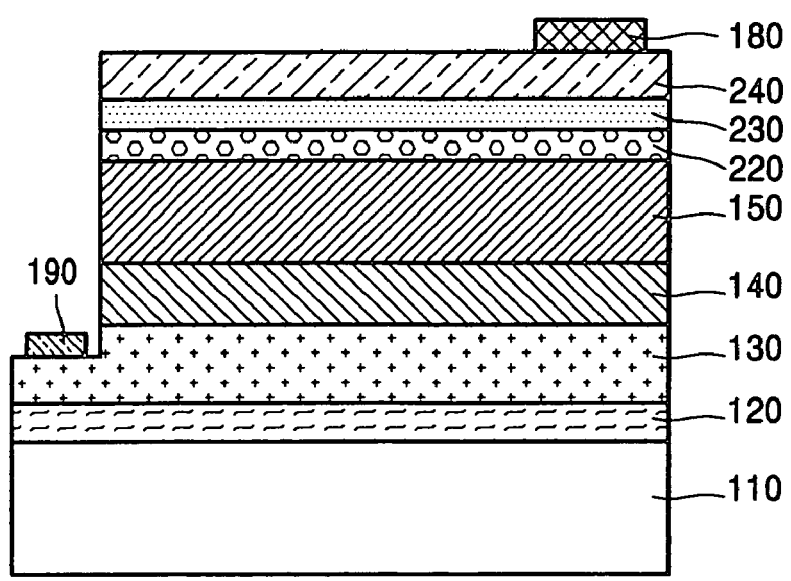

As shown in FIG. 10, the light emitting device may have a structure in which the electrode layer 220, the ohmic contact layer 230, and the reflective layer 240 are sequentially formed on the p-cladding layer 150. The electrode layer 220 is composed of an alloy or solid solution of one or two elements selected from Ni, Au, Pt, Pd, Mg, Cu, Zn, Ag, Sc, Co, Rh, Li, Be, Ca, Ru, Re, Ti, Ta, Na, and LA. Since the elements constituting the electrode layer 220 can adjust the concentration of p-type Zn-containing oxide, it may be advantageous to form a p-GaN ohmic contact. The reflective layer 240 may be made of a metal selected from the group consisting of Ag, Al, Zn, Mg, Ru, Ti, Rh, Cr, and Pt.

Figure 11:
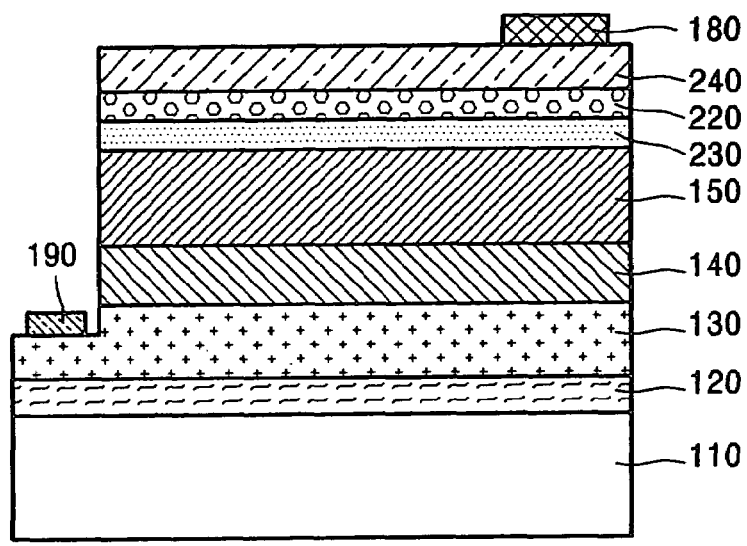

Referring to FIG. 11, the light emitting device may also have a structure in which the ohmic contact layer 230, the electrode layer 220, and the reflective layer 240 are sequentially formed on the p-cladding layer 150. The electrode layer 220 and the reflective layer 240 may each be composed of the materials described earlier with reference to FIG. 10.

Figure 12:
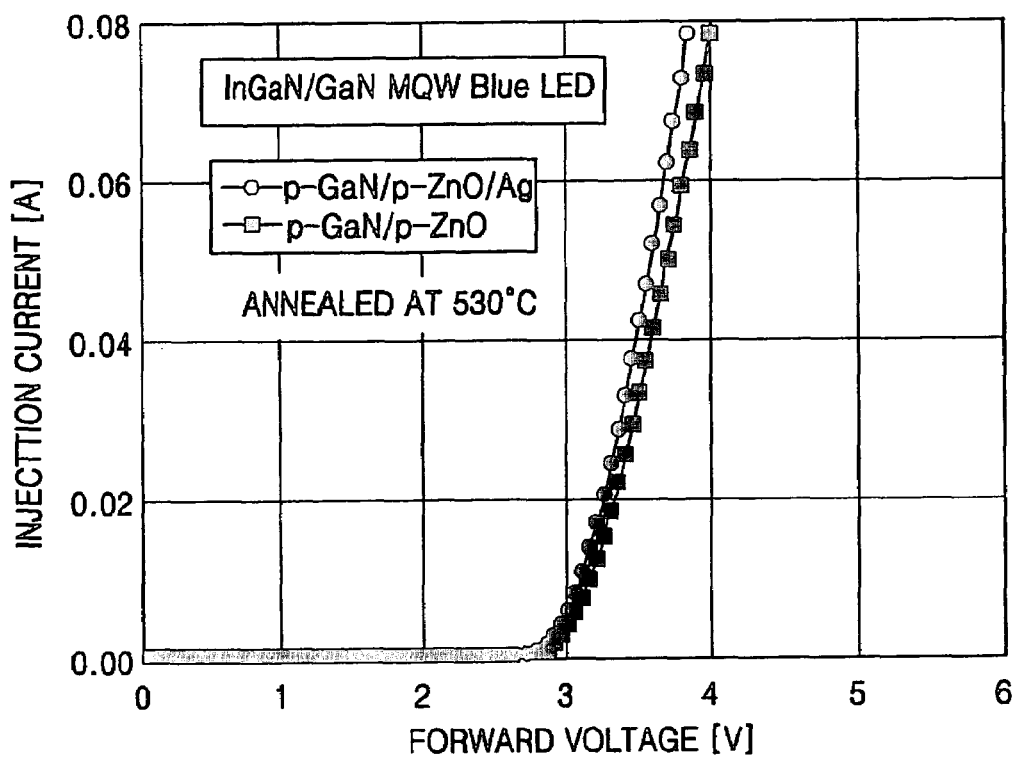
FIG. 12 is a graph showing operating voltages respectively measured after annealing InGaN/GaN multiquantum well (MQW) blue LEDs included in the light emitting devices shown in FIG. 5 and FIG. 9.

FIG. 12 is a graph showing operating voltages respectively measured in InGaN/GaN MQW blue LEDs with the p-ZnO electrode structure having the single ohmic contact layer 230 shown in FIG. 5 and with the p-ZnO/Ag electrode structure including the ohmic contact layer 230 and the reflective layer 240 shown in FIG. 9. In this case, annealing was performed at 530° C. in an air atmosphere. The thickness of the single ohmic contact layer in the p-ZnO electrode structure was 300 nm, and the thicknesses of the ohmic contact layer 230 and the reflective layer 240 in the p-ZnO/Ag electrode structure were 100 nm and 200 nm, respectively.

As is evident from FIG. 12, operating voltages of the light emitting devices with the p-ZnO electrode structure and the p-ZnO/Ag electrode structure are 3.33 V and 3.23 V, respectively, which are lower than an operating voltage of 3.45 V in a conventional Ni/Au electrode structure.

Figure 13:
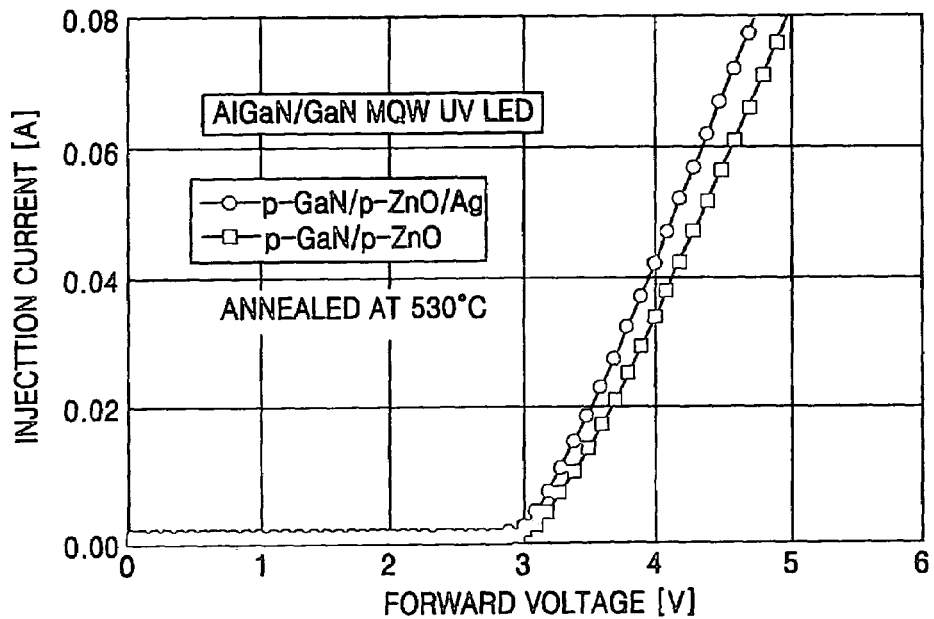
FIG. 13 is a graph showing operating voltages respectively measured after annealing InGaN/GaN MQW ultraviolet (UV) LEDs included in the light emitting devices shown in FIG. 5 and FIG. 9.

FIG. 13 is a graph showing operating voltages respectively measured in InGaN/GaN MQW ultraviolet (UV) LEDs with the same p-electrode structures as those used to obtain the results shown in FIG. 12. Referring to FIG. 13, the operating voltages of the light emitting devices with the p-ZnO and p-ZnO/Ag electrode structures were 3.67 V and 3.54 V at 20 mA, respectively. Although the light emitting devices have high operating voltages, it is expected that the above-described structures can be used to realize a light emitting device with good operating voltage characteristics in view of the results achieved during the initial phase of the development of UV LEDs.

Figure 14:
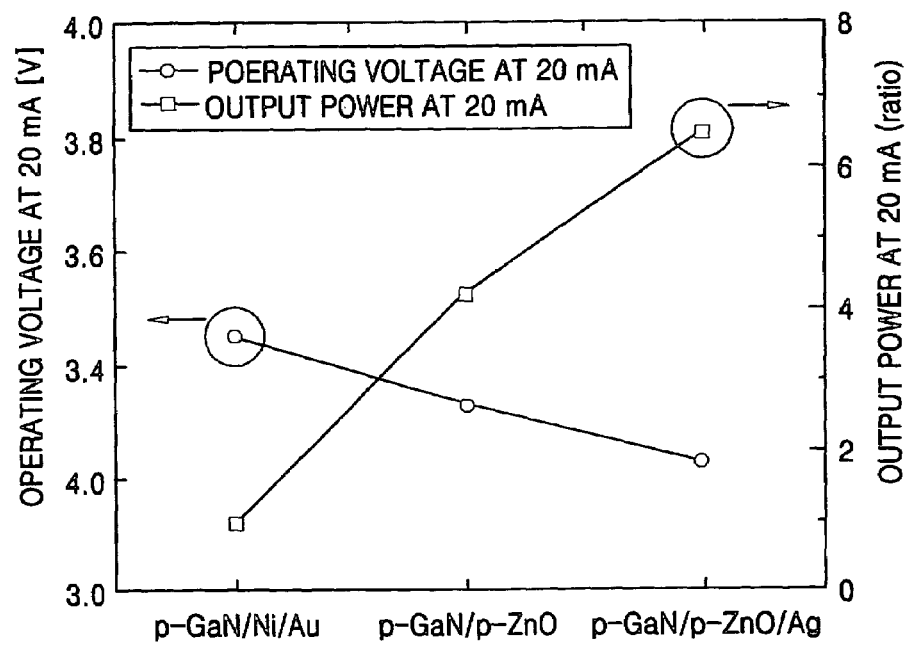
FIG. 14 is a graph showing a relationship between operating voltages and output powers measured after annealing InGaN/GaN MQW blue LEDs with the p-electrode structures according to the first and second embodiments of the present invention.

FIG. 14 is a graph showing relationships between operating voltages and output powers measured after annealing InGaN/GaN MQW blue LEDs with the p-ZnO electrode structure of FIG. 1, the p-ZnO/Ag electrode structure of FIG. 2, and a conventional Ni/Au electrode structure in air ambient. As is evident from FIG. 14, the p-ZnO and p-ZnO/Ag electrode structures can provide high equality light emitting devices with extremely low operating voltages and excellent output power that is four times higher than that obtained with the conventional Ni/Au electrode structure.

A nitride-based light emitting device with a transparent film electrode and a method of fabricating the same according to the present invention provides excellent I-V characteristics by improving ohmic contact with a p-cladding layer while significantly enhancing light emission efficiency of the device due to high light transmittance of a transparent electrode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a nitride-based light emitting device in which at least an n-cladding layer, an active layer, and a p-cladding layer are sequentially formed on a substrate, the method comprising:

forming an ohmic contact layer composed of a Zn-containing oxide containing a p-type dopant on the p-cladding layer; and annealing the resultant structure obtained by the forming of the ohmic contact layer, wherein the Zn-containing oxide is a compound selected from the group consisting of magnesium zinc-oxide, ($Mg_xZn_{1-x}O$), and beryllium zinc-oxide ($Be_xZn_{1-x}O$).

2. The method of claim 1, wherein the p-type dopant is at least one of phosphor (P) and nitrogen (N).

3. The method of claim 1, wherein the active layer has an InGaN/GaN multiquantum well (MQW) or AlGaN/GaN MQW structure.

4. The method of claim 1, wherein the concentration of the p-type dopant contained in the Zn-containing oxide is in the range of 0.01 to 30 percent by weight.

5. The method of claim 1, wherein the ohmic contact layer is formed to a thickness of 0.1 to 1,000 nm.

6. The method of claim 1, wherein the ohmic contact layer is formed using one selected from the group consisting of an electron-beam evaporator, sputtering deposition, and pulsed laser deposition.

7. The method of claim 6, wherein the temperature during the deposition of the ohmic contact layer is in the range of 20 to 1,500° C. and the pressure during the deposition ranges from atmospheric pressure to $10^{-12}$ Torr.

8. The method of claim 1, further comprising forming an n-current blocking layer on the p-cladding layer before the forming the ohmic contact layer.

9. The method of claim 8, wherein the n-current blocking layer is formed to a thickness of 0.1 to 500 nm.

10. The method of claim 8, wherein the n-current blocking layer is composed of a transparent conductive oxide or an n-GaN-based compound.

11. The method of claim 10, wherein the transparent conductive oxide is one selected from the group consisting of $In_2O_3$, $SnO_2$, and indium tin oxide (ITO).

12. The method of claim 1, further comprising, before the forming the ohmic contact layer, forming a first electrode layer on the p-cladding layer from at least one element selected from the group consisting of Ni, Au, Pt, Pd, Mg, Cu, Zn, Ag, Sc, Co, Rh, Li, Be, Ca, Ru, Re, Ti, Ta, Na, and La.

13. The method of claim 1, further comprising, before the annealing, forming a second electrode layer on the ohmic contact layer from at least one element selected from the group consisting of Ni, Au, Pt, Pd, Mg, Cu, Zn, Ag, Sc, Co, Rh, Li, Be, Ca, Ru, Re, Ti, Ta, Na, and La.

14. The method of claim 1, further comprising, before the annealing, forming a reflective layer on the ohmic contact layer from at least one element selected from the group consisting of Ag, Al, Zn, Mg, Ru, Ti, Rh, Cr, and Pt.

15. The method of claim 14, wherein the reflective layer is formed to a thickness of 10 to 2,000 nm.

16. The method of claim 14, further comprising, before the forming the ohmic contact layer, forming a first electrode layer on the p-cladding layer from at least one selected from the group consisting of Ni, Au, Pt, Pd, Mg, Cu, Zn, Ag, Sc, Co, Rh, Li, Be, Ca, Ru, Re, Ti, Ta, Na, and La.

17. The method of claim 14, further comprising, before the forming the reflective layer, forming a second electrode layer on the ohmic contact layer from at least one selected from the group consisting of Ni, Au, Pt, Pd, Mg, Cu, Zn, Ag, Sc, Co, Rh, Li, Be, Ca, Ru, Re, Ti, Ta, Na, and La.

18. The method of claim 12, wherein the first electrode layer is formed to a thickness of 0.1 to 1,000 nm.

19. The method of claim 1, wherein the annealing is performed at a temperature of 100 to 800° C.

20. The method of claim 1, wherein the annealing is performed for 10 seconds to 3 hours.

21. The method of claim 1, wherein the annealing is performed in a gaseous atmosphere containing at least one of $N_2$, Ar, He, $O_2$, H, and air.

22. The method of claim 1, wherein the step of forming an ohmic contact layer includes forming the ohmic contact layer over the entirety of the p-cladding layer, and the method further comprises forming a p-type electrode on the oymic contact layer.

* * * * *